(12) United States Patent
Hsu et al.

(10) Patent No.: US 11,855,539 B2
(45) Date of Patent: *Dec. 26, 2023

(54) POWER MODULE

(71) Applicant: Taiwan Semiconductor Manufacturing Company, Ltd., Hsinchu (TW)

(72) Inventors: Ying-Chih Hsu, Hsinchu (TW); Eric Soenen, Austin, TX (US); Alan Roth, Leander, TX (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/590,513

(22) Filed: Feb. 1, 2022

(65) Prior Publication Data

US 2022/0158556 A1 May 19, 2022

Related U.S. Application Data

(62) Division of application No. 15/901,578, filed on Feb. 21, 2018, now Pat. No. 11,245,329.

(60) Provisional application No. 62/565,578, filed on Sep. 29, 2017.

(51) Int. Cl.
*H02M 3/158* (2006.01)
*H03H 7/01* (2006.01)
*H02M 3/155* (2006.01)
*H01L 25/11* (2006.01)

(52) U.S. Cl.
CPC ........... *H02M 3/158* (2013.01); *H01L 25/115* (2013.01); *H02M 3/155* (2013.01); *H03H 7/0115* (2013.01)

(58) Field of Classification Search
CPC ...... H02M 3/158; H02M 3/155; H02M 3/003; H01L 25/115; H03H 7/0115
USPC .......................................................... 307/52
See application file for complete search history.

(56) References Cited

U.S. PATENT DOCUMENTS

| | | | |
|---|---|---|---|
| 3,040,240 A | 6/1962 | Gotal et al. | |
| 6,853,169 B2 | 2/2005 | Burstein et al. | |
| 7,199,695 B1 | 4/2007 | Zhou et al. | |
| 8,957,514 B1 | 2/2015 | Barnette | |
| 9,054,086 B2 | 6/2015 | Lotfi et al. | |
| 9,729,059 B1 | 8/2017 | Parto | |
| 9,768,705 B1 | 9/2017 | Midya et al. | |
| 9,799,721 B2 | 10/2017 | Kuo et al. | |
| 10,069,417 B2 | 9/2018 | Iravani et al. | |
| 11,245,329 B2 * | 2/2022 | Hsu | H02M 3/155 |
| 2004/0052098 A1 * | 3/2004 | Burstein | H02M 3/1584 363/72 |

(Continued)

OTHER PUBLICATIONS

Jiguparmar ,"understanding vector group of transformer ( part 1)" 2012, pp. 1-2 (Year: 2012).*

*Primary Examiner* — Alfonso Perez Borroto
(74) *Attorney, Agent, or Firm* — Merchant & Gould P.C.

(57) ABSTRACT

A power converter module includes a ground terminal, an input voltage terminal configured to receive a raw input voltage, and an interconnection terminal configured to provide a regulated output voltage to a load such as a SOC or SIP system to be powered. A voltage regulator is connected to the ground terminal and the input voltage terminal. An inductor has an inductor output connected to the interconnection terminal.

20 Claims, 11 Drawing Sheets

(56) References Cited

U.S. PATENT DOCUMENTS

| | | | | |
|---|---|---|---|---|
| 2005/0040796 | A1* | 2/2005 | Sutardja | H02M 3/157 323/247 |
| 2005/0040798 | A1* | 2/2005 | Chen | G05F 1/575 323/282 |
| 2006/0273771 | A1* | 12/2006 | van Ettinger | G05F 1/575 323/273 |
| 2006/0274513 | A1* | 12/2006 | Panella | H05K 1/0262 257/691 |
| 2008/0002380 | A1 | 1/2008 | Hazucha et al. | |
| 2008/0080103 | A1 | 4/2008 | Paillet et al. | |
| 2008/0309442 | A1* | 12/2008 | Hebert | H01F 27/292 257/738 |
| 2010/0246152 | A1 | 9/2010 | Lin et al. | |
| 2010/0259239 | A1 | 10/2010 | Shi et al. | |
| 2011/0188218 | A1* | 8/2011 | Hsing | H01R 9/00 361/772 |
| 2011/0317387 | A1 | 12/2011 | Pan et al. | |
| 2012/0068320 | A1* | 3/2012 | Yang | H01L 23/49541 257/676 |
| 2013/0221442 | A1 | 8/2013 | Joshi | |
| 2013/0292814 | A1* | 11/2013 | Yang | H01L 23/49503 257/676 |
| 2014/0091449 | A1* | 4/2014 | Fernando | H01L 23/49575 257/676 |
| 2014/0097498 | A1* | 4/2014 | Fernando | H01L 23/49575 257/368 |
| 2014/0097531 | A1* | 4/2014 | Fernando | H01L 23/49575 257/676 |
| 2014/0103514 | A1* | 4/2014 | Fernando | H01L 23/49562 257/676 |
| 2014/0253279 | A1 | 9/2014 | Doyle et al. | |
| 2015/0008892 | A1* | 1/2015 | Augesky | H02M 3/158 323/272 |
| 2015/0070850 | A1 | 3/2015 | Moss | |
| 2015/0116973 | A1 | 4/2015 | Chen et al. | |
| 2015/0162297 | A1 | 6/2015 | Cho et al. | |
| 2016/0155692 | A1 | 6/2016 | Dosluoglu | |
| 2016/0233192 | A1* | 8/2016 | Dosluoglu | H01L 24/06 |
| 2017/0331371 | A1 | 11/2017 | Parto | |
| 2018/0364784 | A1* | 12/2018 | Luo | G06F 1/3287 |

* cited by examiner

POWER MODULE

CROSS REFERENCE TO RELATED APPLICATIONS

This application is a division of U.S. patent application Ser. No. 15/901,578, filed Feb. 21, 2018, and titled "Power Module", now U.S. Pat. No. 11,245,329, which claims the benefit of U.S. Provisional Application No. 62/565,578, filed Sep. 29, 2017, and titled "Power Module," the disclosure of each of which is hereby incorporated herein by reference in its entirety.

BACKGROUND

A voltage regulator converts an input voltage to a different output voltage. An example of a typical application is a battery powered electronic device such as a portable computer. In an example such as this, a voltage regulator is required to provide a predetermined and constant output voltage to a load from an often fluctuating input voltage source, the battery.

Depending on several factors, such as the arrangement of power regulator components relative to components of the powered system, known power regulation devices have shortfalls, such as coupling and heating effects, parasitic capacitance at the output stage, interconnection and integration limitations, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
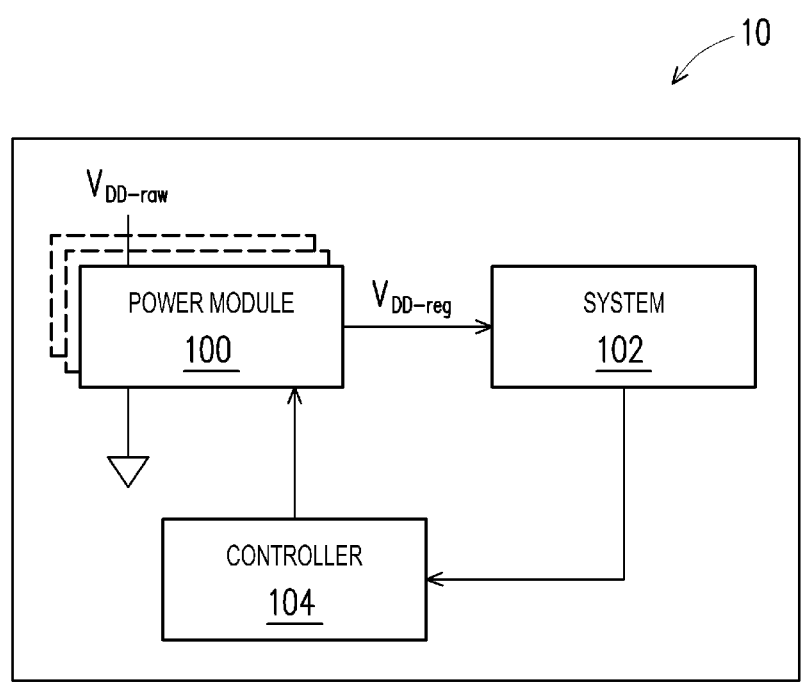
FIG. 1 is a block diagram illustrating aspects of a modular power system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Power management is a necessary function in a variety of integrated circuit applications. A typical integrated circuit may include a variety of systems formed by a large number of interconnected components formed on a semiconductor die, and power requirements for such integrated systems can vary widely.

Power converters are used to provide the desired power for a load. A buck converter, for example, converts an input voltage to a lower output voltage. A synchronous buck converter includes a pair of switches coupled in series across the input voltage source. One switch is coupled to the voltage source and the other switch is connected to ground. An output filter typically including an inductor and a capacitor is connected to a junction formed by the pair of switches for providing the output voltage to the load. A controller drives the switches to connect the output filter to the voltage supply or to ground to maintain the output voltage at a predetermined level.

Depending on several factors, such as the arrangement of power regulator components relative to components of the powered system, known power regulation devices have shortfalls, such as coupling and heating effects, parasitic capacitance at the output stage, interconnection and integration limitations, etc.

FIG. 1 illustrates aspects of a modular power conversion system in accordance with disclosed examples. The power conversion system 10 includes one or more pre-characterized power modules 100 that are connected to a system 102 powered by the power modules 100. A controller 104 (which could be a component of the power modules 100 in some examples) receives feedback from the powered system 102 and controls the power modules 100 so as to output the desired power characteristics.

The powered system 102 could be a system on a chip (SOC) in which the various system components are integrated on a common substrate. In other examples, the powered system 102 is a system in a package (SIP), where different portions of the system 102 are fabricated on a number of substrates and assembled into a package. In some implementations, the power modules 100 are all fabricated on a common substrate, and could be integrated with the system 102 as part of the SOC or SIP.

Figure 2:
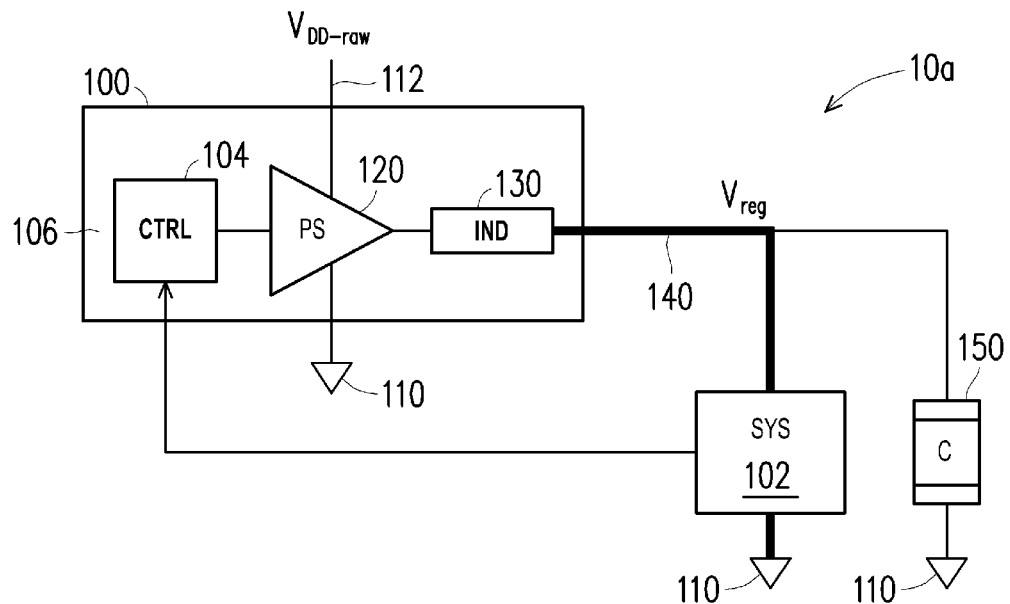
FIG. 2 is a block diagram illustrating further aspects of the modular power system in accordance with some embodiments.
Figure 3:
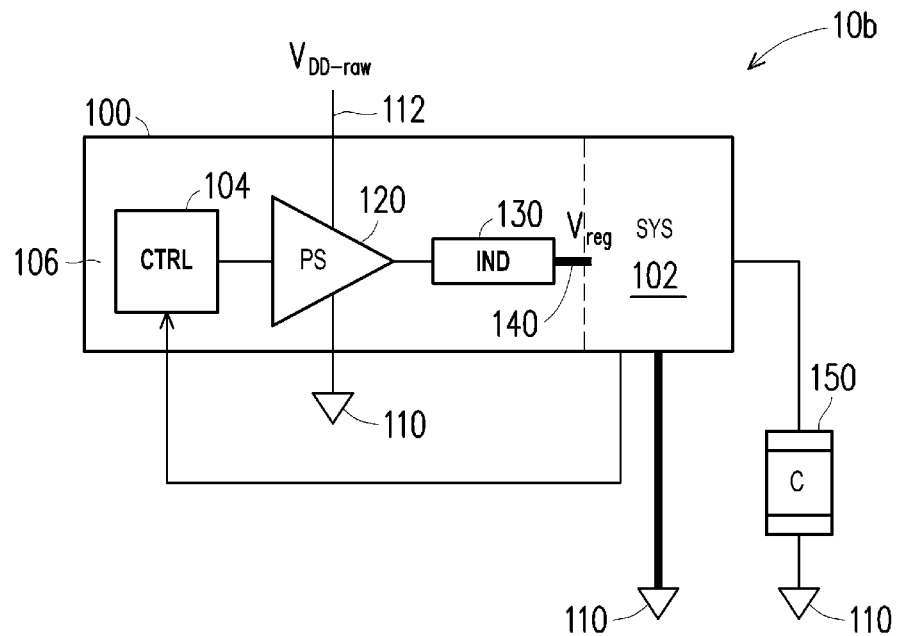
FIG. 3 is a block diagram illustrating further aspects of the modular power system in accordance with some embodiments.

FIGS. 2 and 3 illustrate further aspects of examples of the system 10. In the embodiments illustrated in FIGS. 2 and 3, the power modules 100 each include a ground terminal 110, an input voltage terminal 112 configured to receive a raw input voltage $V_{DD\text{-}raw}$, and an interconnection terminal 140 that provides a regulated output voltage $V_{reg}$ to a load, which is the powered system 102 in the illustrated examples. The power modules 100 additionally include a power stage, or voltage regulator 120 that is connected to the ground terminal 110 and the input voltage terminal 112, as well as an inductor 130 that has an inductor output connected to the interconnection terminal 140. In the illustrated examples, the ground terminal 110 is a global ground terminal, in that the ground of the voltage regulator 120 and the system 102 may be shorted together globally. In some examples, the voltage regulator 120 system 102 ground pins may be separated, depending on the particular SOC or SIP structures.

Figure 4:
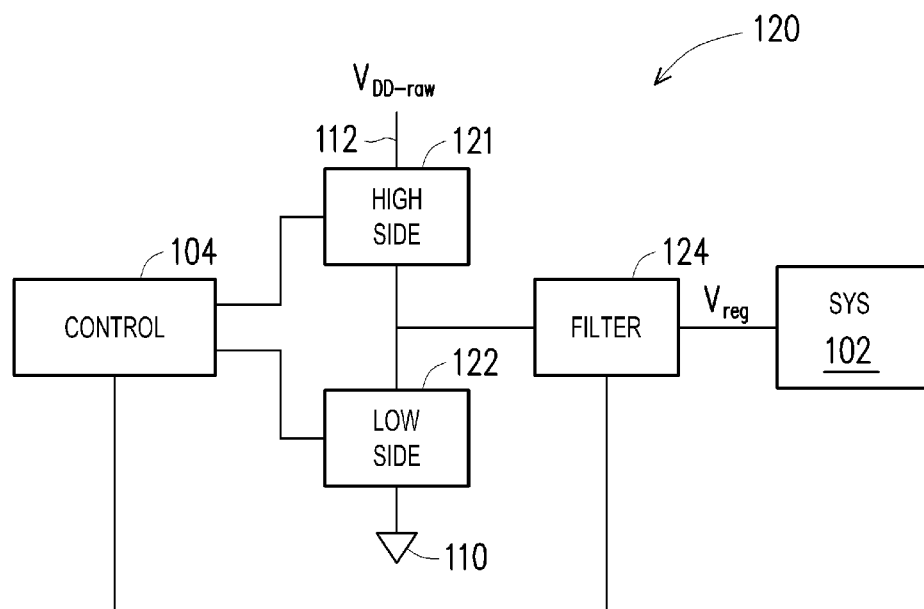
FIG. 4 is a block diagram illustrating aspects of a voltage regulator of the modular power system shown in FIGS. 1-3 in accordance with some embodiments.

The voltage regulator 120 could comprise, for example, a buck converter. Aspects of an example buck converter are shown in FIG. 4. The example voltage regulator 120 of FIG. 4 incudes first and second, or upper and lower, switches 121, 122 coupled in series between the input voltage terminal 112 and the ground terminal 110, with the high side switch 121 coupled to receive the input voltage $V_{DD\text{-}raw}$ and the low side switch 122 connected to ground. In some embodiments, the high side switch 121 comprises a PMOS transistor, while the low side switch comprises an NMOS transistor.

An output filter 124 is connected to a junction formed by the upper and lower switches 121, 122 to provide the output voltage $V_{reg}$ to the system 102. The controller 104 drives the switches to connect the output filter 124 to the input voltage $V_{DD\text{-}raw}$ or to ground to maintain the output voltage $V_{reg}$ at a predetermined level. More specifically, the controller 104 drives a PWM signal to achieve the desired output voltage level, varying the duty cycle of the PWM signal so as to operate the switches 121, 122 to connect and disconnect the output to and from the input voltage source.

The filter 124 includes the inductor 130, as well as a capacitor 150. In the examples of FIGS. 2 and 3, the capacitor is located externally to the power module 100, and may be formed as a component of the system 102 or external thereto. In other implementations, the capacitor 150 may be integrated with the power module 100.

In some examples, the common controller 104 or portions thereof are included in the power module 100, while in other examples the 104 is external to the power module 100. For instance, for a multiphase power module (multiple buck converters connected in parallel) the timing of each phase is offset. In such implementations, it may be desirable to integrate at least a common portion of the controller 106 as part of power module 100. For a specific single phase voltage regulator implementation, one controller 106 could control single voltage regulators 120.

In some embodiments, the voltage regulator 120, inductor 130, and controller 104 are arranged on a common substrate 106. Moreover, FIG. 2 illustrates an example system 10a in which components of the power module 100 are arranged on a common substrate 106, while the powered system 102 is separate therefrom and could be an SIP device. In FIG. 3, the power module 100 and system 102 are all provided on a common substrate 106 and the system 10b could thus be an SOC device.

As noted in conjunction with FIG. 4, the output filter 124 typically includes the inductor 130 and a capacitor 150. In certain examples, the inductor is included as a component of the power module 100, while the capacitor 150 is formed separately therefrom to be close to the powered system 102. In some known power systems the inductors 130 are integrated with the system 102. Such arrangements can result in undesired effects on the voltage regulator 120 and/or the powered system 102, such as unintended coupling and heating from the magnetic effects of the inductor, limited interconnection space by the inductor, reduced efficiency, etc. Such effects must be compensated for with each designed system.

In some examples disclosed herein, the voltage regulator 120 and inductor 130 are provided together as a module 100, and in some implementations are formed on a common substrate. This allows characterizing the module 100 to avoid such undesired effects on the voltage regulator 120 and the powered system 102. Further, the power modules 100 may be constructed so as to output a known, predetermined power level, such as 0.5 amps per module 100. Thus, multiple modules 100 may be interconnected in parallel to provide the loading requirements of the system 102.

Figure 5:
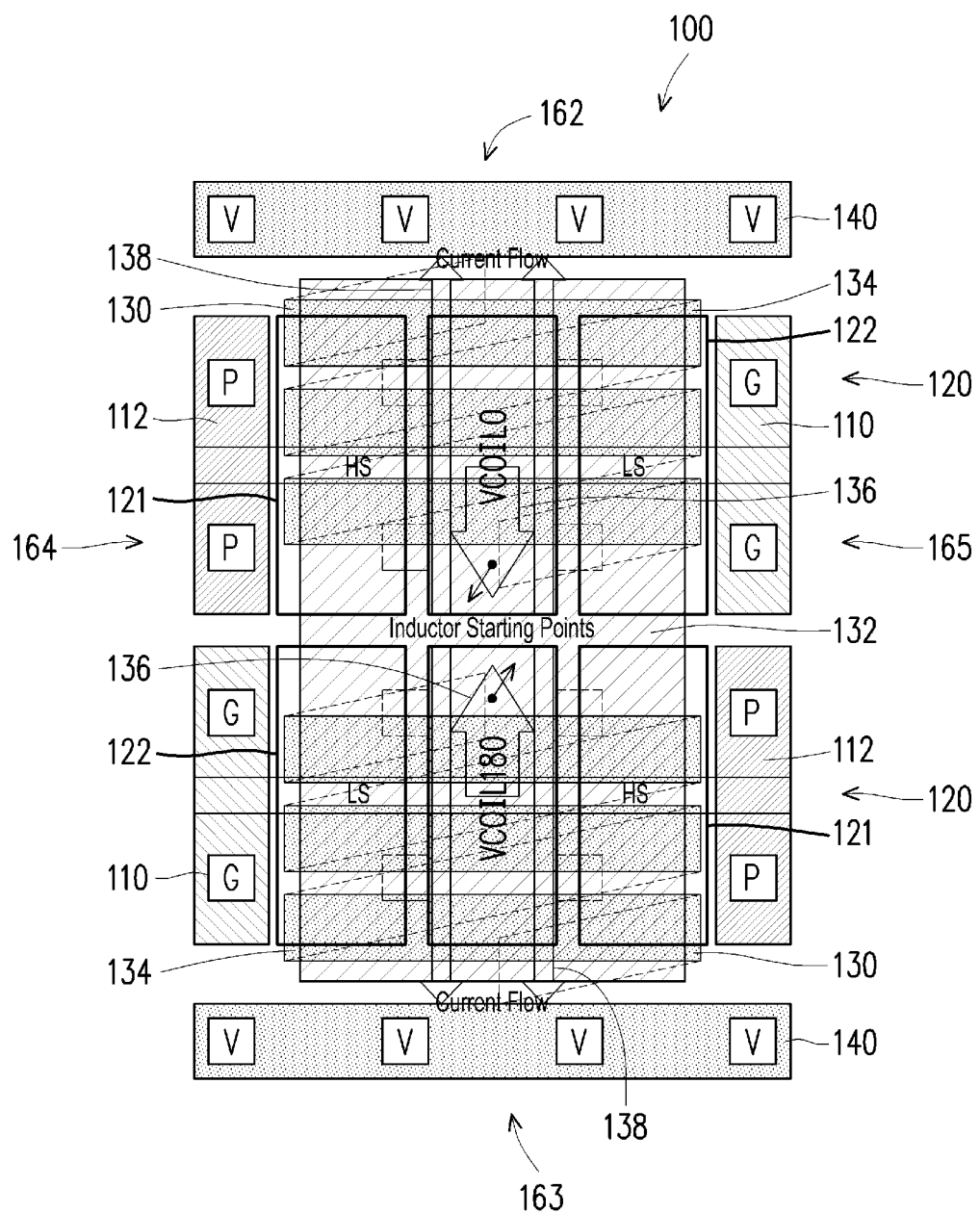
FIG. 5 is a top view illustrating further aspects of the modular power system in accordance with some embodiments.
Figure 6:
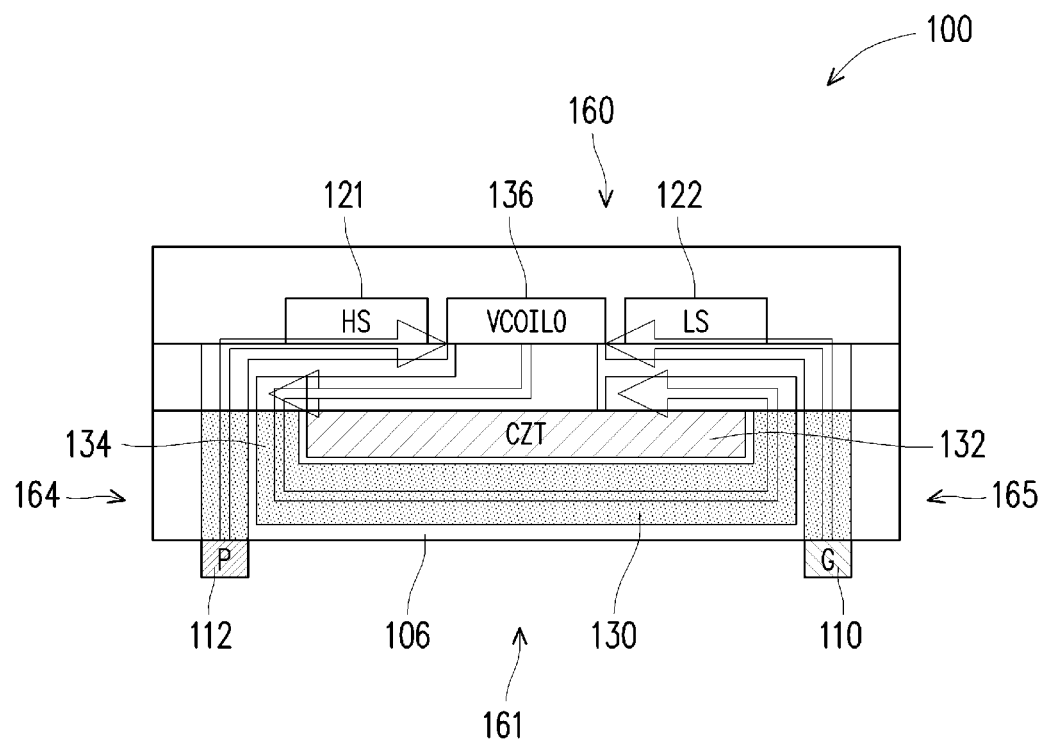
FIG. 6 is a section view illustrating further aspects of the modular power system in accordance with some embodiments.

FIG. 5 is a top view, and FIG. 6 is a cross section end view, illustrating aspects of a layout of the power modules 100. In the example of FIGS. 5 and 6, the high side and low side switches 121, 122 of the voltage regulator 120 are positioned directly over a top side 160 of the inductors 130 (opposite the bottom side 161 of the inductor 130). This "stacked" arrangement in which the voltage regulator 120 and inductor 130 are stacked on the substrate 106 facilitates a larger power density. Further, positioning the inductors 130 and components of the voltage regulator 120 separate from the system 102 and capacitors 150 helps reduce magnetic coupling to the system 102, among other things. As shown in FIG. 6, the high side and low side switches 121, 122 of the voltage regulator 120 are further positioned adjacent lateral sides 164, 165 of the inductor 130, while the voltage input 112 and ground 110 terminals are situated at the bottom side 161 adjacent the lateral sides 164, 165 of the inductors 130. In this manner, the voltage terminals 112 and ground terminals 110 pf the illustrated example are interleaved with the inductors 130 outside the inductor 130 region, which reduces parasitic losses.

Moreover, the illustrated module 100 includes two inductors 130 and voltage regulators 120. The illustrated inductors 130 include a ferromagnetic core 132, with a conductive winding 134 thereabout. In some embodiments, the two inductors 130 shown in FIG. 5 may have a common core 132, with windings 134 situated 180° out of phase with one another as indicated by the arrows 136 labeled Vcoil0 and Vcoil180. Thus, the current flow from the inductor output is shown by arrows 138 to the interconnect terminals 140

(providing the regulated output voltage $V_{reg}$) situated at the end sides 162, 163 of the inductors 130.

Figure 7:
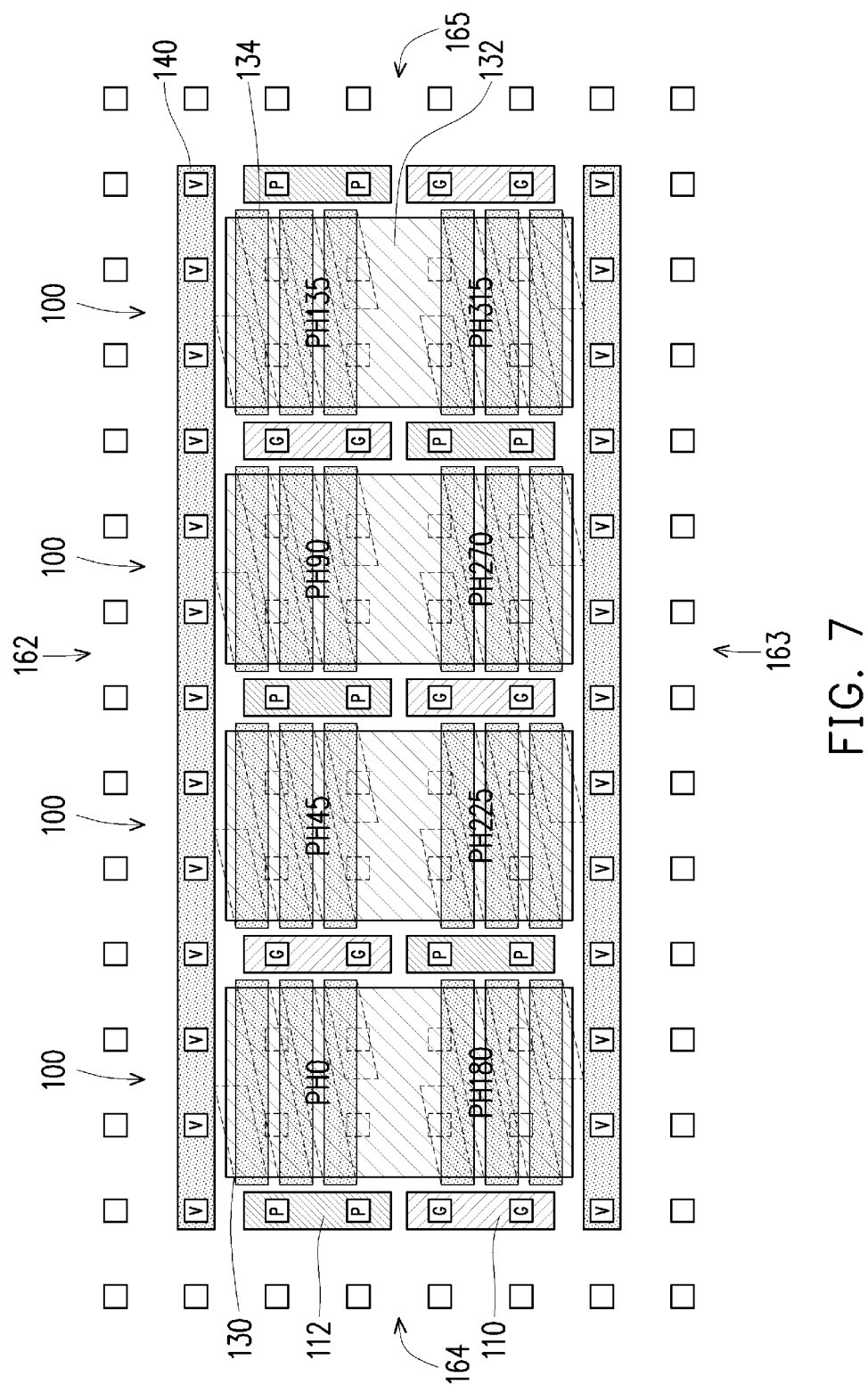
FIG. 7 is a top view illustrating further aspects of the modular power system in accordance with some embodiments.

FIG. 7 illustrates another example in which the power module 100 includes several voltage regulators 120 and inductors 130. As shown in FIGS. 5 and 6, the interconnect terminal 140 for providing the output voltage $V_{reg}$ to the load (e.g. system 102) is provided at the end sides 162, 163 of the inductors 130. The input voltage and ground terminals 112, 110 are positioned on the lateral sides 164, 165 of the inductors 130. In some examples, all of the voltage regulators 120 and inductors 130 are provided on a common substrate, and the power modules 100 are pre-characterized so as to minimize interference with the powered system 102, and to output a predetermined current level.

Figure 8:
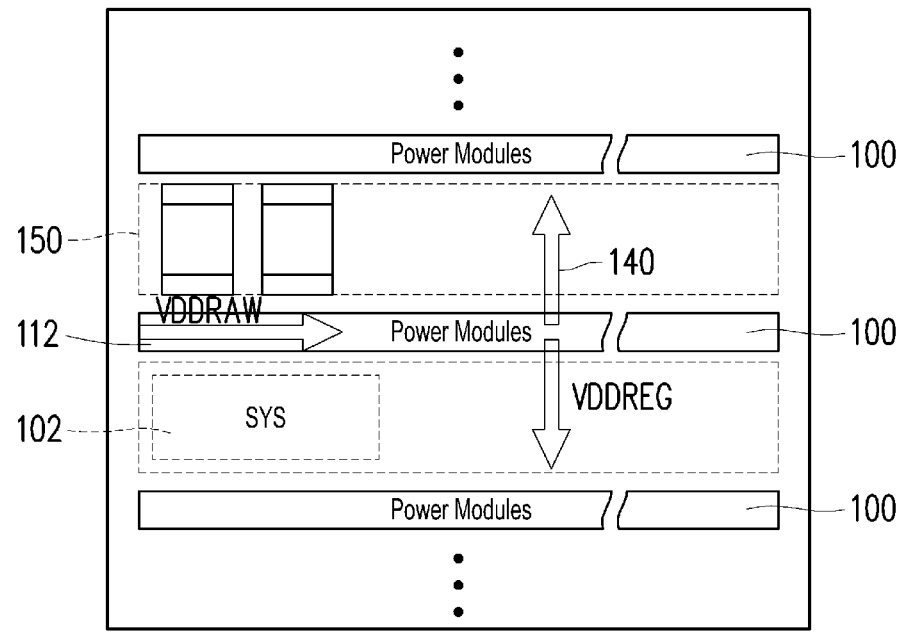
FIG. 8 is a block diagram illustrating multiple interconnected power modules of the modular power system in accordance with some embodiments.

FIG. 8 is a block diagram conceptually illustrating an arrangement of multiple interconnected power modules 100. Each of the power modules 100 is connected to the input terminal 112 to receive the raw input voltage $V_{DD\text{-}raw}$, and also connects to the interconnect terminal 140 to output the regulated voltage $V_{reg}$ to the powered system 102, which as noted previously could be configured either as an SOC or SIP. The filter capacitors 150 are discrete from the power modules 100 in the illustrated example. As mentioned previously, each of the power modules 100 are configured so as to output a current level determined by requirements of the powered system 102. By connecting multiple power modules together in parallel, the desired total current level can be achieved for the system 102 to be powered.

In some examples, all of the power modules 100 are provided on a common substrate. In other implementations, the power modules 100 are arranged on individual substrates. In either situation, the power modules 100 are pre-characterized so as to minimize interference with the powered system 102, and to output a predetermined current level. Thus, several of the power modules 100 may be interconnected to achieve the desired current output and power characteristics.

Figure 9:
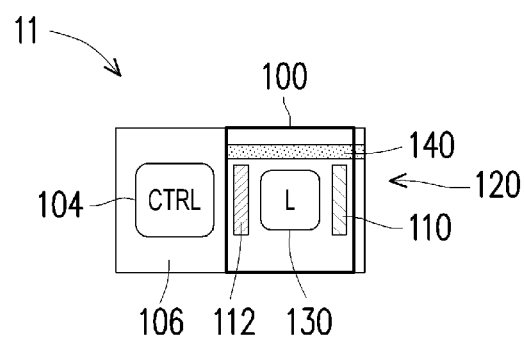
FIG. 9 is a block diagram illustrating a single phase power module system in accordance with some embodiments.
Figure 10:
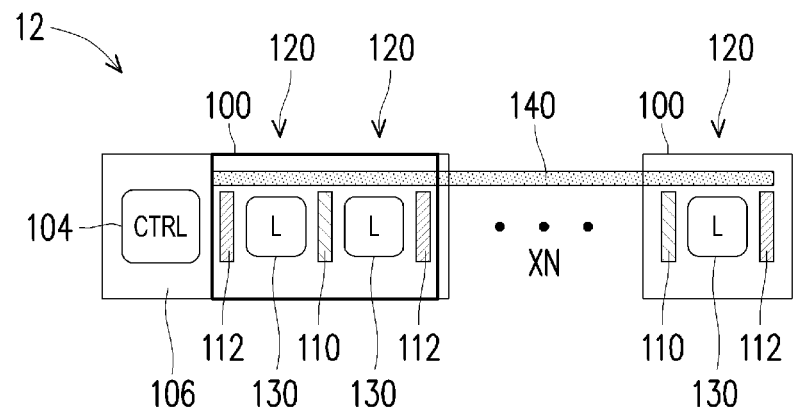
FIG. 10 is a block diagram illustrating a single-ended, side-by-side power module system in accordance with some embodiments.
Figure 11:
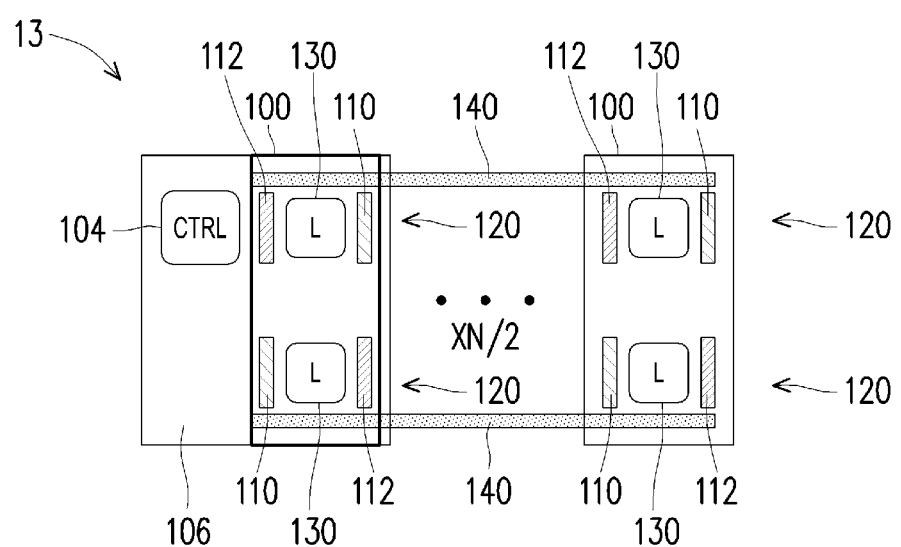
FIG. 11 is a block diagram illustrating a single-ended, end-to-end power module system in accordance with some embodiments.
Figure 12:
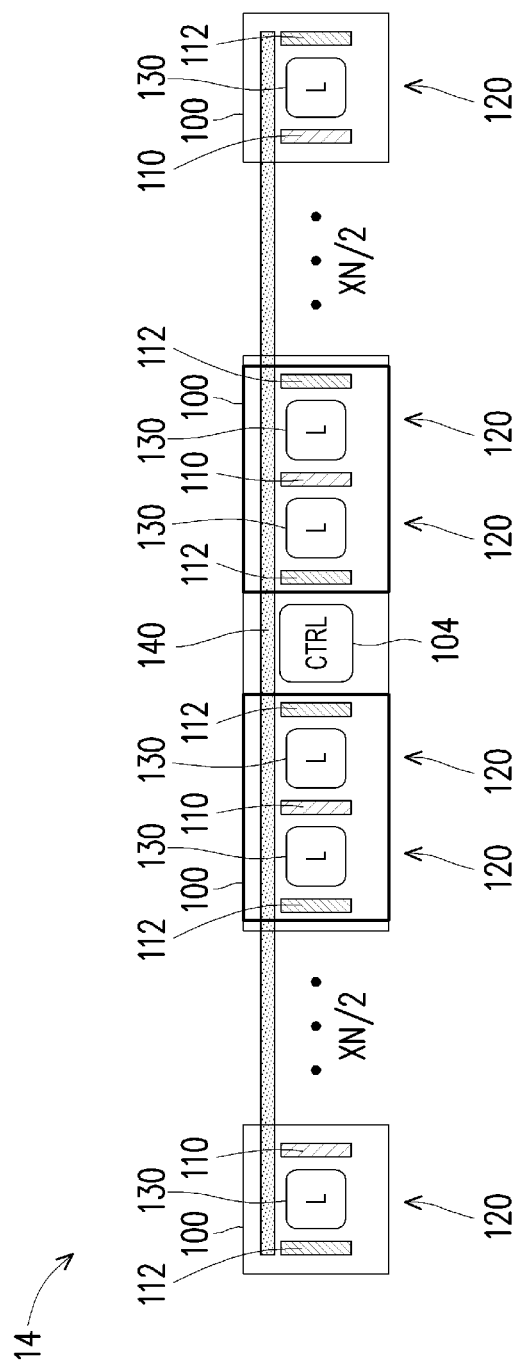
FIG. 12 is a block diagram illustrating a double-ended, side-by-side power module system in accordance with some embodiments.
Figure 13:
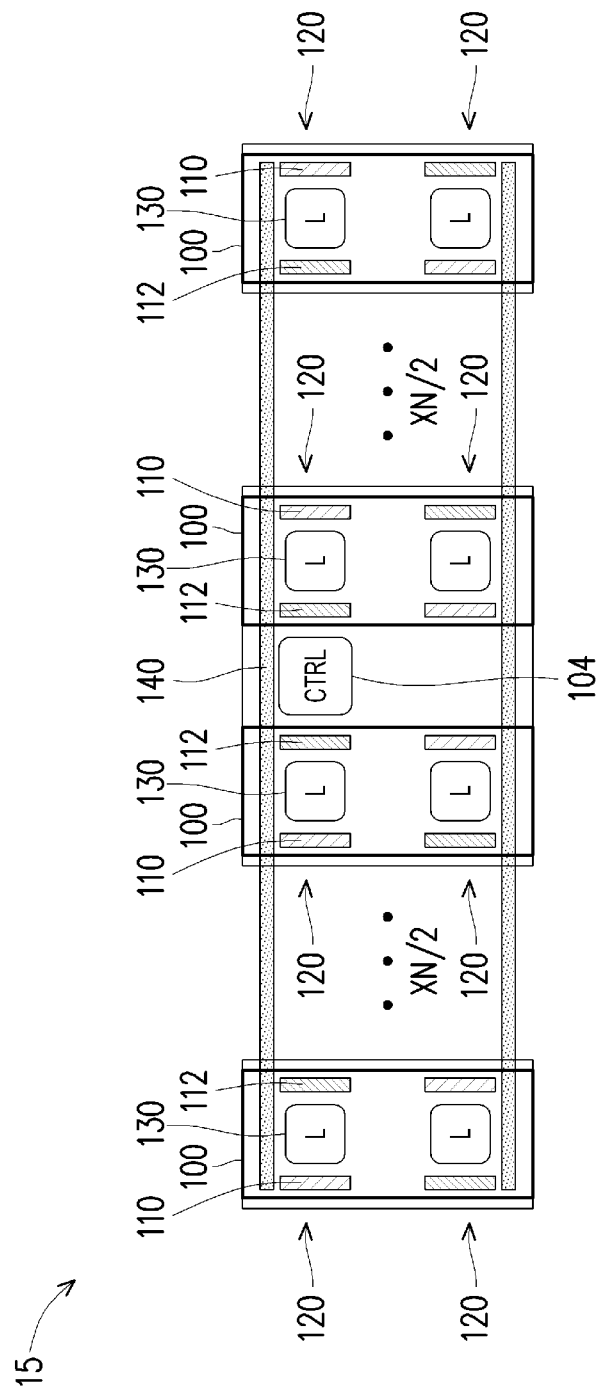
FIG. 13 is a block diagram illustrating a double-ended, end-to-end power module system in accordance with some embodiments.

FIGS. 9-13 illustrate examples of various power module arrangements. The power modules 100 can include different configurations so as to provide flexible and compact power systems meeting SOC or SIP physical dimensions and needs of the powered systems 102. For instance, FIG. 9 shows a simple single phase power module system 11 that includes a controller 104 and a single power module 100 with a voltage regulator 120 and inductor 130. FIG. 10 illustrates an N-phase (N is a positive integer) single-ended, side-by-side power module system 12 that includes a common controller 104 and with N power modules 100. The power modules 100 are arranged in a side-by-side fashion on the substrate 106, with the controller 104 at one end of the power system 12. FIG. 11 illustrates an N-phase single-ended, end-to-end power module system 13 that includes a common controller 104 with N/2 power modules 100. Each of the power modules 100 includes two power modules 120 and inductors 130 arranged end-to-end as described in conjunction with FIG. 5. FIG. 12 illustrates an N-phase double-ended, side-by-side power module system 14 that includes a common controller 104 with N power modules 100 positioned on either side of the controller 104. Each of the power modules 100 are arranged in a side-by-side fashion on the substrate 106. FIG. 13 illustrates an N-phase double-ended, end-to-end power module system 15 that includes a common controller 104 with N/2 power modules 100 positioned on either side of the controller 104. Each of the power modules 100 includes two power modules 120 and inductors 130 arranged end-to-end as described in conjunction with FIG. 5.

Figure 14:
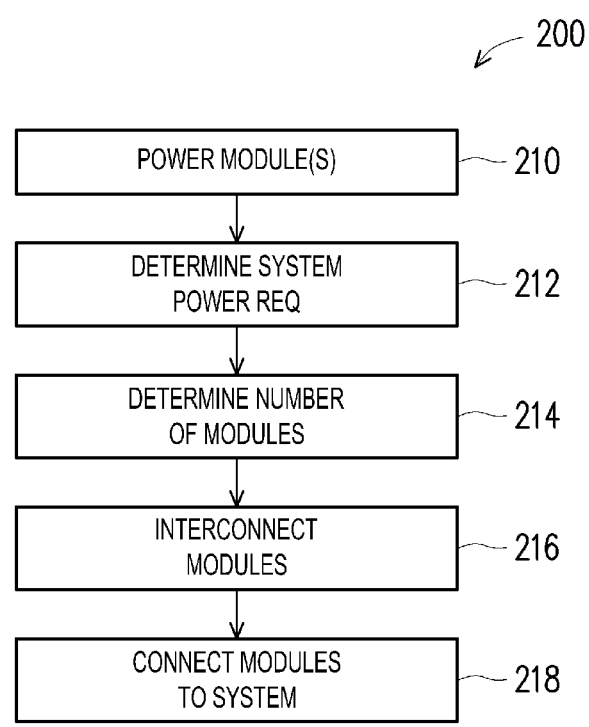
FIG. 14 is a process flow diagram illustrating aspects of a modular power method in accordance with some embodiments.

FIG. 14 is a flow diagram illustrating an example of a modular power method 200 in accordance with further aspects of the disclosure. In block 210, a plurality of power modules are provided, such as the power modules 100 described herein. Thus, each of the power modules 100 is configured to output a predetermined current level and includes a voltage regulator 120 connected to ground terminal 110 and an input voltage terminal 112. The power modules 100 further include an inductor 130 having an inductor output that is connected to an interconnection terminal. Each of the power modules 100 are characterized to output a predetermined current level. In block 212, power requirements for a system to be powered are determined, and in block 214 a number of the power modules required to meet the determined power requirements is determined. The determined number of the power modules are interconnected together in block 216, and the interconnected power modules are connected to the system to be powered in block 218.

Disclosed embodiments include a power converter module that includes a substrate, a ground terminal, an input voltage terminal configured to receive a raw input voltage, and an interconnection terminal configured to provide a regulated output voltage to a load such as a SOC or SIP system to be powered. A voltage regulator is arranged on the substrate and is connected to the ground terminal and the input voltage terminal. An inductor is also arranged on the substrate and has an inductor output connected to the interconnection terminal.

In accordance with further disclosed embodiments, a modular power system includes a ground terminal, an input voltage terminal configured to receive a raw input voltage, and an interconnection terminal. A plurality of power modules each have a voltage regulator connected to the ground terminal and the input voltage terminal, and an inductor having an inductor output connected to the interconnection terminal. Each of the power modules is characterized to output a predetermined current level.

In accordance with still further disclosed embodiments, a modular power method includes providing a plurality of power modules that each are configured to output a predetermined current level. The power modules each have a voltage regulator and are connected to a ground terminal and an input voltage terminal. The power modules each also have an inductor with an inductor output connected to an interconnection terminal. Each of the power modules are characterized to output a predetermined current level. Power requirements for a system to be powered are determined, and a number of power modules required to meet the determined power requirements is further determined. The determined number of the power modules are then interconnected together, and the interconnected power modules are connected to the system to be powered.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for providing power to a system, the method comprising:
   providing a plurality of power modules, each of the plurality of power modules configured to output a predetermined current level, wherein each of the plurality of power modules comprises:
      an input voltage terminal configured to receive a raw input voltage and a ground terminal;
      a voltage regulator connected to the ground terminal and the input voltage terminal, wherein the voltage regulator comprises a first switch and a second switch;
      an inductor having an inductor output connected to an interconnection terminal;
      wherein each of the first switch and the second switch of the voltage regulator are stacked directly over a top side of the inductor such that the inductor is positioned directly between the voltage regulator and a substrate, wherein the inductor is stacked directly over the substrate, wherein the first switch of the voltage regulator is positioned above a first lateral side of the inductor and the second switch of the voltage regulator is positioned above a second lateral side opposite the first lateral side of the inductor, wherein the ground terminal is positioned adjacent the second lateral side, and wherein the input voltage terminal is positioned adjacent the first lateral side of the inductor;
   determining power requirements for the system to be powered;
   determining a number of the plurality of power modules required to meet the determined power requirements;
   interconnecting the number of the plurality of power modules together; and
   connecting the interconnected plurality of power modules to the system to be powered.

2. The method of claim 1, wherein each of the plurality of power modules are formed on a common substrate.

3. The method of claim 1, wherein each of the plurality of power modules are formed on respective substrates.

4. The method of claim 1, wherein the plurality of power modules and the system to be powered are formed on a common substrate.

5. The method of claim 1, wherein the plurality of power modules and the system to be powered are formed on respective substrates.

6. The method of claim 1, wherein the plurality of power modules are connected in parallel.

7. The method of claim 1, wherein the inductor includes a magnetic core.

8. The method of claim 1, wherein a first power module comprises a first inductor and a second power module comprises a second inductor, wherein the first inductor includes a magnetic core with a first conductive winding thereabout, and wherein the second inductor includes the magnetic core with a second conductive winding.

9. The method of claim 8, wherein the second conductive winding is 180° out of phase with the first conductive winding.

10. A system comprising:
    a first power module comprising:
       a first substrate,
       a first inductor stacked over the first substrate, wherein the first inductor comprises a top side opposite a bottom side,
       a ground terminal,
       an input voltage terminal,
       a first voltage regulator comprising a first switch and a second switch, wherein the first voltage regulator is stacked over the top side of the first inductor such that the first inductor is positioned directly between the first voltage regulator and the first substrate, wherein the first switch of the first voltage regulator is positioned over a first lateral side of the first inductor, wherein the second switch of the first voltage regulator is positioned over a second lateral side opposite the first lateral side of the first inductor, wherein the ground terminal is positioned adjacent to the second lateral side, and wherein the input voltage terminal is positioned adjacent to the first lateral side of the first inductor; and
    a second power module connected to the first power module in parallel, wherein the second power module comprises:
       a second substrate,
       a second inductor stacked over the second substrate, wherein the second inductor comprises a top side opposite a bottom side, and
       a second voltage regulator comprising a first switch and a second switch, wherein the second voltage regulator is stacked over the top side of the second inductor such that the second inductor is positioned directly between the second voltage regulator and the second substrate, wherein the first switch of the second voltage regulator is positioned over a first lateral side of the second inductor, and wherein the second switch of the second voltage regulator is positioned over a second lateral side opposite the first lateral side of the second inductor.

11. The system of claim 10, wherein the first voltage regulator is connected to the ground terminal and the input voltage terminal.

12. The system of claim 10, wherein the second voltage regulator is connected to the ground terminal and the input voltage terminal.

13. The system of claim 10, wherein the first substrate and the second substrate are a common substrate.

14. The system of claim 10, wherein the first inductor comprises a common core and a first winding around the common core, wherein the second inductor comprises a second winding around the common core, and wherein the second winding is 180° out of phase with the first winding.

15. The system of claim 14, wherein the common core comprises a magnetic core.

16. A system for providing a power, the system comprising a plurality of power modules, each of the plurality of power modules configured to output a predetermined current level, wherein each of the plurality of power modules comprises:
    a substrate;
    a ground terminal;
    an input voltage terminal;
    a plurality of inductors stacked over the substrate, the plurality of inductors comprising:
       a first inductor comprising a common core and a first winding around the common core, and
       a second inductor comprising a second winding around the common core, wherein the second winding is 180° out of phase with the first winding; and
    a voltage regulator comprising a first switch and a second switch, wherein the voltage regulator is stacked over a top side of the plurality of inductors such that the plurality of inductors are positioned directly between the voltage regulator and the substrate, wherein the first switch of the voltage regulator is positioned over a first lateral side of the plurality of inductors, wherein the second switch of the voltage regulator is positioned over a second lateral side opposite the first lateral side of the plurality of inductors, wherein the ground terminal is positioned adjacent the second lateral side of the plurality of inductors, and wherein the input voltage terminal is positioned adjacent the first lateral side of the plurality of inductors.

17. The system of claim 16, wherein the common core comprises a magnetic core.

18. The system of claim 16, wherein the voltage regulator is connected to the ground terminal and the input voltage terminal.

19. The system of claim 16, further comprising an interconnection terminal configured to provide a regulated output voltage to a load.

20. The system of claim 16, wherein the second conductive winding is 180° out of phase with the first conductive winding.

\* \* \* \* \*